(12) United States Patent
Colburn et al.

(10) Patent No.: US 7,517,637 B2
(45) Date of Patent: *Apr. 14, 2009

(54) METHOD OF PRODUCING SELF-ALIGNED MASK IN CONJUNCTION WITH BLOCKING MASK, ARTICLES PRODUCED BY SAME AND COMPOSITION FOR SAME

(75) Inventors: Matthew E Colburn, Hopewell Junction, NY (US); Satyanarayana V Nitta, Poughquag, NY (US); Sampath Purushothaman, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 1043 days.

This patent is subject to a terminal disclaimer.

(21) Appl. No.: 10/804,552

(22) Filed: Mar. 19, 2004

(65) Prior Publication Data

US 2005/0208430 A1 Sep. 22, 2005

(51) Int. Cl.
*G03F 7/00* (2006.01)
(52) U.S. Cl. .................. 430/311; 430/313; 430/317; 430/325
(58) Field of Classification Search ................ 430/311, 430/313, 317, 325
See application file for complete search history.

(56) References Cited

U.S. PATENT DOCUMENTS

| 7,030,495 | B2 * | 4/2006 | Colburn et al. ............... 257/760 |
| 7,037,744 | B2 * | 5/2006 | Colburn et al. ............... 438/52 |
| 7,268,432 | B2 * | 9/2007 | Colburn et al. ............... 257/774 |

* cited by examiner

*Primary Examiner*—Amanda C. Walke
(74) *Attorney, Agent, or Firm*—Ohlandt, Greeley, Ruggiero & Perle, L.L.P.; Daniel P. Morris, Esq.

(57) ABSTRACT

A method of forming a self aligned pattern on an existing pattern on a substrate including applying a coating of a solution containing a masking material in a carrier, the masking material being either photo or thermally sensitive; performing a blanket exposure of the substrate; and allowing at least a portion of the masking material to preferentially develop in a fashion that replicates the existing pattern of the substrate. The existing pattern includes a first set of regions of the substrate having a first reflectivity and a second set of regions of the substrate having a second reflectivity different from the first composition. The first set of regions can include one or more metal elements and the second set of regions can include one or more dielectrics. Structures made in accordance with the method. A low resolution mask is used to block out regions over the substrate. Additionally, the resist can be applied over another masking layer that contains a separate pattern.

18 Claims, 5 Drawing Sheets

METHOD OF PRODUCING SELF-ALIGNED MASK IN CONJUNCTION WITH BLOCKING MASK, ARTICLES PRODUCED BY SAME AND COMPOSITION FOR SAME

BACKGROUND OF THE INVENTION

1. Field of the Invention

This invention relates to the production of patterns on a substrate having regions with different chemical identities. More particularly, it relates to a method of producing fine patterns on substrates used in, for example, the microelectronics industry on which electronic devices are fabricated. The present invention also relates to devices fabricated in accordance with these methods.

2. Description of the Related Art

A number of applications and technologies involve structures having a well-defined arrangement of distinct regions. Normally, these structures are defined by patterning processes such as lithography, embossing, and stamping, and have length scales ranging from nanometers to several microns to even millimeters. In many of these systems it may be necessary or beneficial to apply an additional component or treatment to or above only a subset of the chemically district regions. One commonly used technique for doing this is through the use of a mask to protect regions wherein this additional application or treatment is not desired. Effectively, the mask material directs this treatment to the intended surfaces that are fully exposed. Unfortunately, typical procedures used to generate a mask by lithographic or other means can be expensive and error prone particularly when alignment or overlay is required. Thus, techniques for circumventing these conventional approaches would be highly advantageous.

A particular example in which such strategies would be useful involves integrated circuits comprised of metal and dielectric components. It is widely known that the speed of propagation of interconnect signals is one of the most important factors controlling overall circuit speed as feature sizes are reduced and the number of devices per unit area is increased. Throughout the semiconductor industry, there has been a strong drive to reduce the dielectric constant, k, of the dielectric materials existing between metal lines and/or to minimize the thickness of layers have comparatively larger dielectric constants, e.g., cap barrier layer.

Both of these approaches reduce the effective dielectric constant, $k_{eff}$, of the components between metal lines and as a result, interconnect signals travel faster through conductors due to a reduction in resistance-capacitance (RC) delays. Unfortunately, these strategies are difficult to implement due to limitations in maintaining sufficient properties, i.e., mechanical, barrier, electrical, etc., that result when there is a reduction in thickness or changes in the chemistry of the layers.

SUMMARY OF THE INVENTION

The present invention provides a method of forming a patterned layer on a substrate having thereon a pre-patterned film. The method includes the steps of:

applying onto the substrate having thereon a pre-patterned film a solution of a masking material in a carrier;

removing at least a portion of the carrier to form a coating;

patternwise exposing the coating to radiation in conjunction with a blocking mask so that the radiation is transmitted through the coating and is reflected back to the coating at least in part by features in the pre-patterned film to produce a patterned layer having exposed and unexposed regions with a given spatial intensity distribution; and developing the exposed and unexposed regions to reveal a mask pattern on the coating commensurate with the spatial intensity distribution generated during exposure to radiation to produce the self-aligned patterned layer on the pre-patterned film.

The present invention further provides a structure including:

a substrate having thereon a pre-patterned film onto which a self aligned patterned layer is formed, wherein the patterned layer on the pre-patterned film is defined by a spatial reflectivity map of the substrate; wherein the patterned layer disposed on the pre-patterned film is prepared from a coating including a masking material having exposed and unexposed regions with a given spatial intensity distribution, wherein the exposed and unexposed regions have been developed to reveal a mask pattern on the coating commensurate with the spatial intensity distribution generated during exposure to radiation to form the exposed and unexposed regions; and wherein a blocking mask pattern is optionally used to block formation of the self-aligned pattern in the patterned layer in certain regions.

The present invention still further provides a structure prepared by a method, which includes the steps of:

applying onto a substrate having thereon a pre-patterned film a solution of a masking material in a carrier;

removing at least a portion of the carrier to form a coating;

patternwise exposing the coating to radiation in conjunction with a blocking mask so that the radiation is transmitted through the coating and is reflected back to the coating to produce a patterned layer having exposed and unexposed regions with a given spatial intensity distribution; and developing the exposed and unexposed regions to reveal a mask pattern on the coating commensurate with the spatial intensity distribution generated during exposure to radiation to produce the self-aligned patterned layer on the pre-patterned film. The self-aligned patterned layer is spatially aligned to the pre-patterned film and the self-aligned pattern is limited to regions wherein the block mask allows for irradiation or illumination.

The present invention also provides a microelectronic device that includes these structures.

The present invention enables the production of patterns on a substrate having regions with different chemical identities and provides efficient methods of producing fine patterns on substrates on which electronic devices used in the microelectronics industry can be fabricated.

The present invention also provides devices fabricated in accordance with these methods.

The patterns can be fabricated with great precision, accuracy and at low cost, without the use of typical high-resolution lithography reticles and without the use of lithography that typically requires high-resolution overlay of a mask pattern to a substrate having a pre-patterned film thereon.

The present invention also provides other additional advantages, which will become apparent from the detailed description of the invention set forth below.

BRIEF DESCRIPTION OF THE DRAWINGS

FIG. 1-*a* shows a cross-section of an interconnect structure having a substrate, a via-level dielectric, a line-level dielectric, an optional hardmask, a conductive line and a liner material. The structure has two distinct regions with distinct reflectivity.

FIG. 1A-*b* shows a structure in which a resist film coated over the surface and exposed to actinic light source for selective development.

FIG. 1A-*c* shows a structure in which hardmask and dielectric material are etched from the space between the metal lines.

FIG. 1B-*b* shows a structure in which the resist film is coated over the surface and exposed to actinic light.

FIG. 1B-*c* shows a structure in which a barrier cap material is deposited into the self-aligned openings in the resist.

FIG. 1B-*d* shows a structure in which the resist material is removed.

FIG. 1B-*e* shows a structure in which the hardmask and the dielectric are removed from the space between the metal lines.

DETAILED DESCRIPTION OF THE INVENTION

The present invention provides a method of forming a patterned layer on a substrate having thereon a pre-patterned film. The method includes the steps of: applying onto the substrate having thereon a pre-patterned film a solution of a masking material in a carrier; removing at least a portion of the carrier to form a coating; patternwise exposing the coating to radiation in conjunction with a blocking mask pattern so that the radiation that is passed through the blocking mask is transmitted through the coating and is reflected back to the coating to produce a latent image in the layer having exposed and unexposed regions with a given spatial intensity distribution commensurate with the convolution of the block mask pattern and the spatial reflectivity map of the substrate having thereon a pre-patterned film; and developing the exposed coating to reveal a mask pattern in the coating commensurate with the spatial intensity distribution generated during exposure to radiation; and transferring the resulting pattern of the self-aligned layer into the pre-patterned film to generate a new pattern; wherein the coating having thereon a developed pattern is a self aligned patterned layer.

The present invention further provides a structure including a substrate having thereon a patterned layer. The patterned layer is formed by transferring a self-aligned pattern layer into the substrate having thereon a pre-patterned film. The self-aligned patterned layer is disposed within a coating. The self-aligned pattern is defined by a spatial reflectivity map of the substrate convolved with a blocking mask pattern.

The interconnect structure on the silicon wafer is defined above generically by the pre-patterned film. The resist is defined generically as a coating. The spatial intensity distribution is defined by the convolution of the block mask pattern as imaged at the coating surface and the reflectivity of the substrate with the interconnect structure (pre-patterned film). The self-aligned pattern is in the resist. This pattern must be transferred into the pre-patterned film to generate the new structure/pattern.

This invention relates to a method to fabricate mask layers onto a pre-patterned substrate having two or more regions of distinct reflectivity or chemical composition, or two or more composite structures adjacent to one another of distinct reflectivity or chemical composition.

A self-aligned mask is produced in a film that is sensitive to light or heat. An example of such a film is a conventional photoresist.

Typical resist films have a threshold dose required to undergo some type of conversion or switch, for example a switch in polarity, solubility, or stability, and consequently respond to a development procedure. Using the difference in reflectivity of adjacent regions on the substrate, dose variations in the photoresist can be generated that mimic the spatial reflectivity differences on the substrate. Reflectivity is known to be a strong function of wavelength.

By selecting an appropriate dose, resist formulation, resist processing, the photoresist can be switched in some regions above the underlying pattern while remaining unswitched in other regions as dictated by the differences in reflectivity of the underlying patterned substrate. Consequently, the pattern generated in the resist is self-aligned to the substrate upon which it is placed.

Combining this process with a low resolution mask reticle that blocks exposure of certain regions of a pre-patterned substrate, a resist pattern is generated on the wafer which is a convolution of the projected blocking mask and the self-aligned patterning of the specialized resist system. For example, the blocking mask can be designed to block the exposure of resist over regions of the pre-patterned substrate that do not require additional processing or treatment.

If the self aligned lithographic process results in resist pattern above an interconnect structure with a blanket cap layer, an etch process can be used to remove the unprotected cap layer between the metal lines over the entire wafer. However, if combined with a blocking mask exposure, regions of interconnect structure for which it is not necessary to reduce the effective dielectric constant can be protected with a continuous cap layer and afford greater structural integrity.

An example of such a region is isolated lines or the kerf (the regions on a semiconductor wafer between adjacent die).

Further, the resist pattern can be used to pattern a sacrificial material used to etch its pattern into the substrate while protecting the material under the resist pattern. It may also be used to generate a negative pattern to protect material between the resist pattern.

This method can apply to any technology or application involving a heterogeneous substrate including: interconnect structures for high speed microprocessors, application specific integrated circuits (ASICs), memory storage, displays, hi-throughput screening methods, such as, a lab on a chip, microfabricated fluidic devices, etc.

The utility of this method stems from a simple and robust means in which the replication of a patterned substrate can be performed to generate a mask layer, thereby circumventing the requirement for difficult and error prone methods, such as, high resolution alignment of a lithography mask relative to a pre-patterned substrate.

For example, die by die alignment is not required for a pattern that only protects kerf regions on the periphery of the die. Only a coarse, wafer level alignment is required. Additionally, since the high resolution patterning in the present method is self-aligned, relatively crude exposure systems can be adequately employed. Accordingly, the present invention provides an advantageous low cost and more manufacturable alternative to the prior art techniques.

Further, the present invention provides a method of replicating a high-resolution pattern on a pre-patterned substrate in such as manner as to act as a mask using a self-aligned technique based on the reflectivity or chemical composition of the substrate in conjunction with a low resolution pattern that does not require high resolution alignment. Therefore, the alignment requirements of the patterning are decoupled from the overlay requirements of a high resolution pattern. For example, if the minimum feature size on a substrate is 100 nm then the alignment typically would require a 33 nm tolerance. However, with self-aligned lithographic processes, the alignment of the self-aligned features are fixed to the wafer pattern while allowing the large features (1-1000 microns) to have overlay tolerance to be of its length scale. This resolution is within the range of relatively crude and inexpensive stages by semiconductor lithography tool standards, thus allowing reduced cost of ownership.

By using these processes the resist can be self-aligned such that stringent overlay processes are not required to define the features. Both tones of masking can be beneficial depending on subsequent processing requirements.

A further benefit is that neither an expensive lithography mask nor an expensive lithography tooling system is required. Rather, a simple exposure tool that is able to generate a blanket exposure can be utilized.

It is beneficial to have an exposure system that is monochromatic. The blocking mask and self-aligned resist can be exposed with a contact or near-contact printer as well as a projection lithography system. For example, a 50 nm line can not be printed with reasonable process window using 632 nm light using conventional projection optics.

In the example of integrated circuits, the use of the self-aligned masks allows a unique process in which the effective dielectric constant between metal lines can be reduced through selective or non-selective treatment or processing of high k cap or hardmask dielectric material between the metal lines. Such a process is of great importance in maximizing the propagation speed of interconnect signals and ultimately provides faster overall circuit performance. Furthermore, the present invention leads to a higher level of protection and reliability of interconnect structures and reduced processing costs relative to comparable lithographic processes utilizing overlay strategies.

Although the utilization of the self-aligned masks are described for microelectronic parts, this method is envisioned to be useful for any application in which the modification of a specific component in a pre-patterned substrate is beneficial and the pre-patterned substrate has distinct regions of reflectivity that are commensurate with the existing pattern on the substrate.

While the examples shown are for regions of difference reflectivity, the method and structures generated by this method are equally applicable to systems or substrates with different regions of absorbance or transparency.

Blanket exposure can be made from any direction or surface relative to the pre-patterned substrate/mask layer. For example, a Si wafer patterned with a metallic pattern can be exposed with infrared (IR) radiation from either surface of the Si wafer. In this case, the IR transmits through the Si wafer and the metallic pattern on the surface generates an intensity map in the masking material self-aligned with the metallic pattern.

The present invention provides a method of forming a self aligned pattern on an existing pattern on a substrate. The method includes the steps of: applying a coating of a solution containing a masking material in a carrier (or solvent), wherein the masking material is photo or thermally sensitive; exposing the coated masking material to a blanket exposure with sufficient dose to generate some response in the masking material; optionally utilizing a blocking mask to protect the resist from exposure in regions specified by the projected blocking mask image; and allowing at least a portion of the masking material to preferentially develop over portions of the existing pattern in either positive or negative tone.

The masking material can be selected from any photosensitive material and can include functionalized acrylates, functionalized norbornenes, functionalized styrenes, or it can be any material suitable for a photoresist or thermally sensitive resist.

The film thickness must be tuned to optimize the process window. Typically this occurs at maxima or minima in the "Swing Curve" which is a plot of reflectivity versus resist thickness over a substrate of interest Another embodiment includes the combination of the self-aligned patterning process in conjunction with a nanocolumnar pattern on the wafer. For example, a diblock copolymer can be used to generate vertical holes in a continuous film after selective removal of one block of the copolymer film. This film can be immiscible or made immiscible in a "self-aligned" resist's casting solvent. The "self-aligned" resist can be coated over a pre-patterned wafer, which already has a coated film of a polymer or masking material with nanocolumnar holes thereon. Optionally, the nanocolumnar pattern can be used as a mask and transferred into an immiscible layer upon which the self-aligned resist can be applied. The self-aligned exposure described previously is then used to develop a pattern that mimics the spatial reflectivity of the substrate as before, except that the nanocolumnar holes in the film generated by the diblock copolymer film are exposed but only in regions commensurate with the pre-existing pattern on the substrate. This combined pattern can then be used to protect regions of the substrate to subsequent processing such as etch. The self-aligned resist tone can be adjusted to protect the interconnect conductors, for example, while etching the surrounding dielectric through the nanocolumnar holes.

This embodiment can be extended to include self-aligned lithography, blocking masks, and nanocolumnar patterns all in one structure. In this approach, the self-aligned resist is exposed through a low resolution blocking mask. The self-aligned resist coated on the nanocolumnar film can be generated by, for example, a developed diblock copolymer film. This embodiment can also be extended to the formation of air gaps by removal of the material adjacent to an etched nanocolumnar hole.

The pattern on the substrate includes a first set of regions of the substrate having a first atomic composition and a second set of regions of the substrate having a second atomic composition different from the first composition. The first set of regions can include one or more metal elements and the second set of regions can include a dielectric. The patterned substrate can include a layered composite film stack that has distinct regions of different reflectivity adjacent to one another. The pattern in the resist mask layer can then be generated by removing a portion of the film by at least one of rinsing, ultrasonication, dissolution, thermolysis, or decomposition.

The masking material can be applied to the substrate by a method selected from: spin-coating, dip coating, spray coating, and using a doctor blade.

Regions of the substrate can include copper or aluminum or any conductive material including conductive polymers and can be patterned electrical interconnects. The substrate can be a silicon wafer containing electronic devices. The substrate can be, either in part or in its entirety, Si, $SiO_2$, Ga, GaAs, In, InP, InAlP, or any other suitable semiconducting material, inorganic or organic in nature.

The structure can include at least one conductive feature, formed on the substrate, with the substrate further including at least one insulating layer surrounding the conductive feature. The insulating layer can surround at least one conductive feature at its bottom and lateral surfaces. The structure can further include at least one conductive barrier layer disposed at, at least one interface between the insulating layer and the at least one conductive feature. The combination of the at least one conductive feature and the insulating layers, can be repeated to form a multilevel interconnect stack.

The structure can be one of a microelectronic device chip, a ceramic chip carrier, a microfluidic chip, or an organic chip carrier.

Figure 1A:
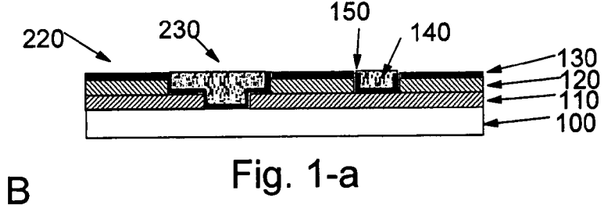
Figure 1B:
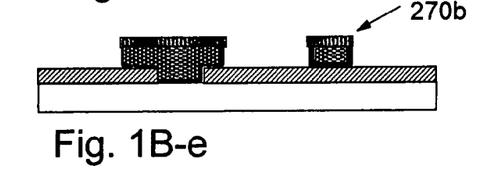

FIGS. 1-a, 1A-b through 1A-c, and 1B-b through 1B-e represent a general flow chart for the process of generating a self aligned mask in accordance with the present invention.

FIG. 1-a shows a cross-section of an interconnect structure having a substrate, a via-level dielectric, a line-level dielectric, an optional hardmask, a conductive line and a liner material. Referring to FIG. 1-a, the structure has two distinct regions with distinct reflectivity. Thus, an interconnect structure containing a substrate 100, a via-level dielectric 110, a line-level dielectric 120, a hardmask (optional) 130, a conductive line 140 and a liner material 150 can be seen. The structure has two distinct regions 220,230 with distinct reflectivity.

Two process flows, A and B, are shown, which show schematically the two different tones of imaging.

FIG. 1A-b shows a structure in which a resist film coated over the surface and exposed to actinic light source for selective development. Referring to FIG. 1A-b, the resist film is coated over the surface and exposed to actinic light source such that the delivered dose allows for selective development over the region containing the dielectric stack 220 and results in the resist pattern 240a.

FIG. 1A-c shows a structure in which high k dielectric hard mask, and dielectric material are etched with the space between the metal being removed. Thus, the high k hard mask 130 and dielectric material 120 are etched resulting in the structure 250a in which all the dielectrics in the space between the metal are removed (see FIG. 1A-c). The resist is removed for subsequent processing such as selective cap deposition, conformal cap deposition, CVD dielectric deposition, gap fill dielectric coating or other processes known by those skilled in the art. Alternatively, only a portion of the dielectric material between the metal lines may be removed.

FIG. 1B-b shows a structure in which the resist film coated over the surface and exposed to actinic light. Referring to FIG. 1B-b, the resist film is coated over the surface and exposed to actinic light source such that the delivered dose allows for selective development over the region containing the conductive stack 230 and results in the resist pattern 240b.

FIG. 1B-c shows a structure in which a barrier material 260b is deposited or grown over the dielectric stack. If deposited over the resist 240b, some must be removed by polish prior to the resist being stripped.

FIG. 1B-d shows a structure in which the resist material is removed resulting in the structure 260b. The barrier material is then used as a mask to protect the conductive region and results in the structure 270b, which has a space between the line. The resist is removed for subsequent processing such as selective cap deposition, conformal cap deposition, CVD dielectric deposition, dielectric coating or other processes known by those skilled in the art. The barrier material 260b can be left as part of the final structure or be sacrificial and removed prior to further processing.

FIG. 1B-e shows a structure in which the hardmask and the dielectric are removed from the space between the lines to create a void or gap.

Figure 2:
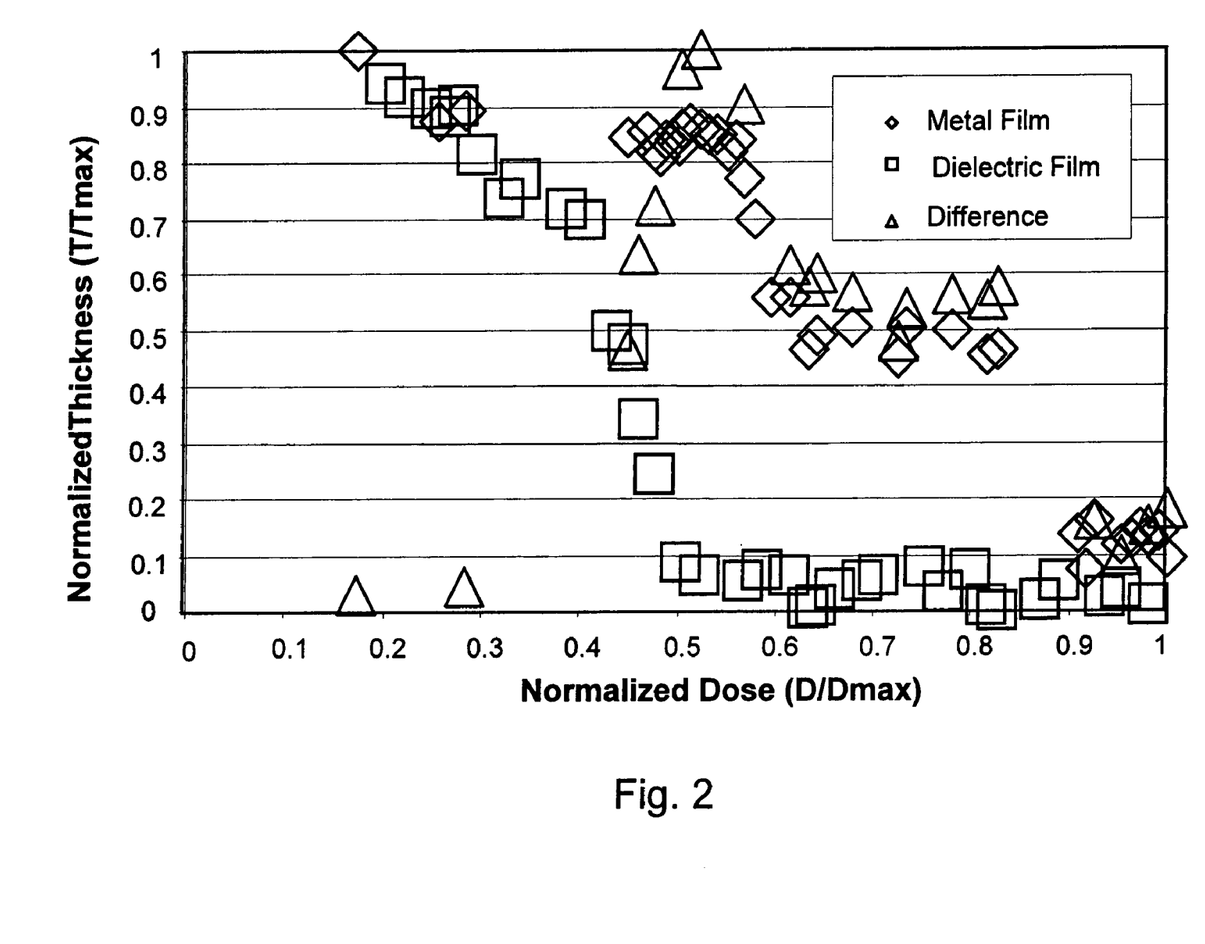
FIG. 2 is a plot of normalized resist thickness as a function of normalized exposure dose for an optimized resist formulation coated on a blanket metallic film and a blanket dielectric stack.

FIG. 2 is a plot of normalized resist thickness as a function of normalized exposure dose for an optimized resist formulation coated on a blanket metallic film and a blanket dielectric stack. Referring to FIG. 2, a plot of normalized resist thickness as a function of normalized exposure dose for an optimized resist formulation coated on a blanket metallic film and a blanket dielectric stack can be seen. The initial thickness of both films was identical. The film coated on the conductive film is shown in diamonds. The film coated on the dielectric stack is shown in triangles. The dose was normalized approximately relative to dose-to-clear. The difference (square) of the normalized film thickness versus dose shows that selective development of the resist film over the dielectric stack when the normalized dose is greater than 0.5.

Figure 3A:
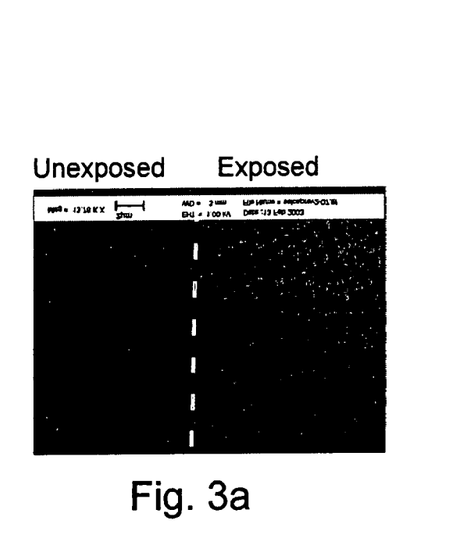
FIG. 3*a* shows a top-down scanning electron image at the edge of an exposure field where the left portion of the film is unexposed and the right portion of the film is exposed.

FIG. 3a shows a top-down scanning electron image at the edge of an exposure field where the left portion of the film is unexposed due to the blocking mask and the right portion of the film is exposed. Thus, this demonstrates the combination of a blocking mask with the self-aligned pattern in the exposure region.

Figure 3B:
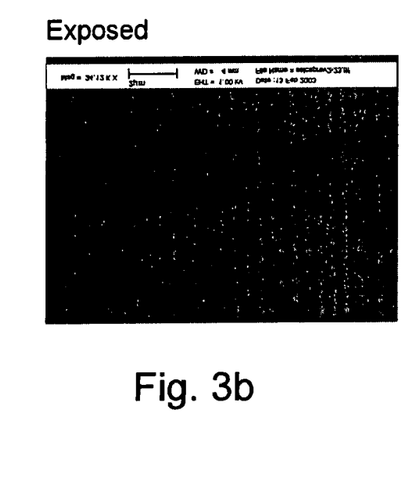
FIG. 3*b* shows a region of periodic conductive lines and dielectric regions that has been coated, exposed, developed and analyzed by scanning electron microscopy.

FIG. 3b shows a region of periodic conductive lines and dielectric regions that has been coated, exposed, developed and analyzed by scanning electron microscopy.

Figure 3C:
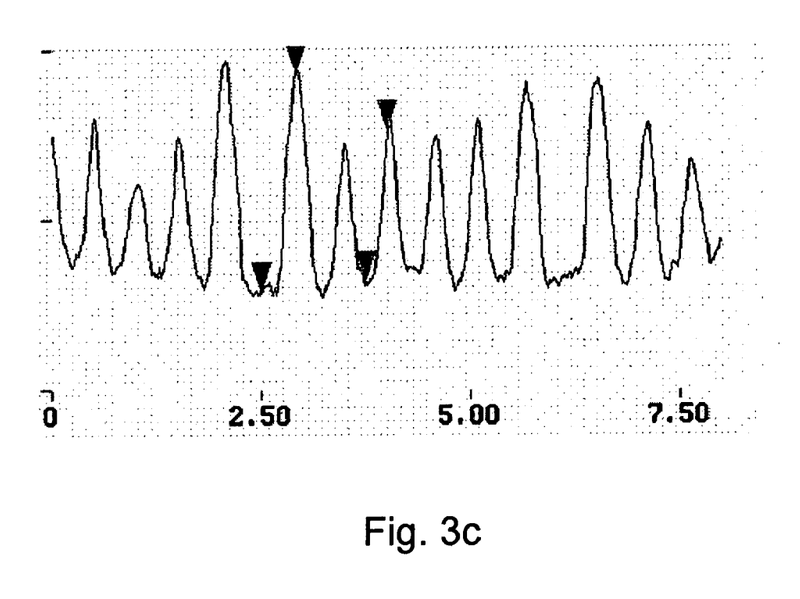
FIG. 3*c* shows the atomic force microscope line scan of the region in FIG. 3*b*.

FIG. 3c shows the atomic force microscope line scan of the region in FIG. 3b. The line scan verifies the topography of the resist. The line scan of the initial surface prior to coating with the resist was flat.

Figure 4A:
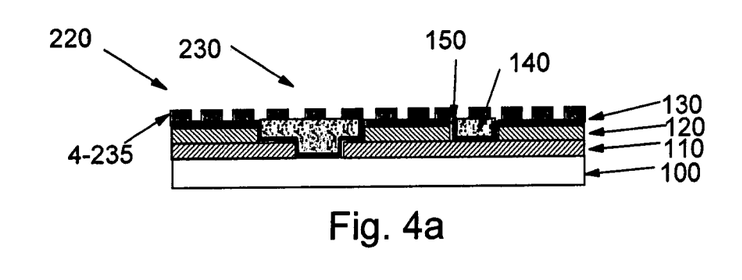
FIG. 4*a* shows a nanocolumnar film structure generated using a diblock film disposed on a substrate with an interconnect structure.

FIG. 4a schematically shows the generation of a nanocolumnar structure 4-235 using a diblock film. If a poly(styrene-b-methyl methacrylate) film is developed to generate such a structure, optionally, the remaining polystyrene can be rendered crosslinked by ultraviolet exposure while the poly(methyl methacrylate) degrades under ultraviolet light. Once the nanocolumnar film is thus fixed, a self-aligned resist is coated at the proper conditions to allow for self-aligned development. Alternatively, the diblock pattern can be transferred into an underlying layer(s) that is (are) insoluble in the "self-aligned" resist casting solvent.

Figure 4B:
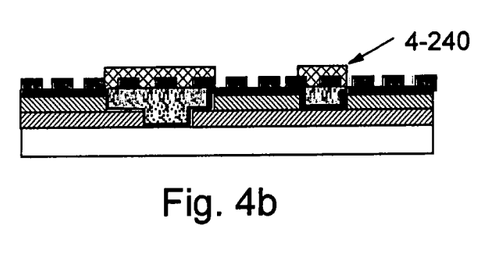
FIG. 4*b* shows a structure in which a self-aligned resist film is exposed and the reflectivity differences in the substrate results in a pattern generated on the surface of the wafer over the nanocolumnar structure.

FIG. 4b shows a structure in which a self-aligned resist film is exposed and the reflectivity differences of the substrate surface results in a pattern 4-240 generated on the surface of the wafer over the nanocolumnar structure.

A blocking mask can be used to protect specific structures from exposure and hence from development for a positive tone resist system (not shown).

Figure 4C:
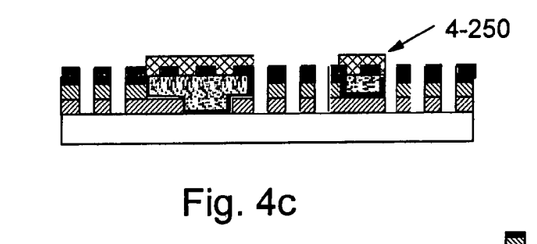
FIG. 4*c* shows a structure in which the pattern is used to protect the structure from reactive ion etch.

FIG. 4c shows a structure in which the pattern in FIG. 4b is used to protect the structure from subsequent processing. For example, it can protect the structure 4-250 from reactive ion etch. The result is the transfer of the blocking mask and nanocolumnar patterns into the substrate.

Figure 4D:
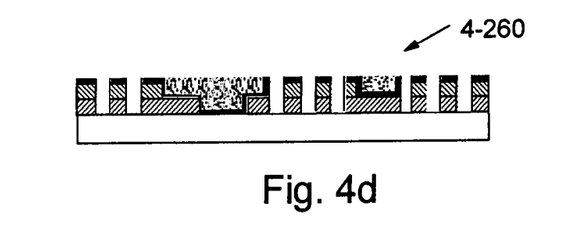
FIG. 4*d* shows a structure in which the resist material has been removed to generate the final interconnect structure.

FIG. 4d shows a structure in which the resist material has been removed to generate the final interconnect structure 4-260.

Figure 5A:
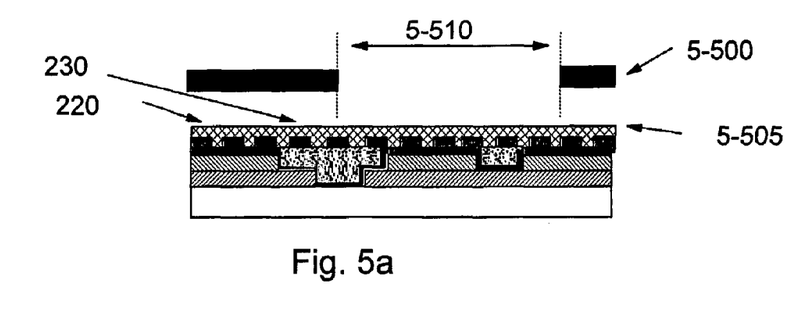
FIG. 5*a* shows exposure through a blocking mask of a resist film coated over a nanocolumnar film structure.

FIG. 5a shows the exposure of a region 5-510 through a blocking mask 5-500 of a resist film 5-505 coated over a nanocolumnar structure 5-520. The blocking mask prevents the exposure of the resist in the outer regions.

This exposure and subsequent development leads to the selective dissolution of the exposed resist over the dielectric stack regions 220 while leaving self-aligned resist pattern to protect the exposed conducting structure 5-520 during etch processing.

Figure 5B:
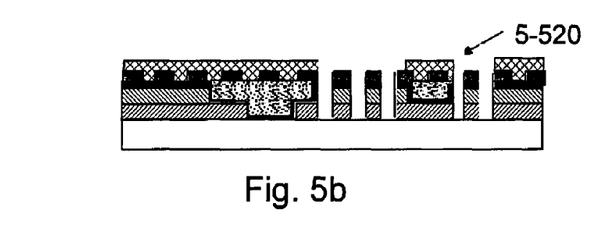
FIG. 5*b* shows a structure in which the resist has been selectively removed.

FIG. 5b shows a structure in which the resist has been selectively removed as described above and the exposed dielectric region has been etched through the nanocolumnar pattern layer.

Figure 5C:
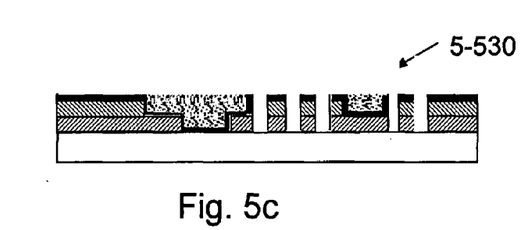
FIG. 5*c* shows a structure in which the resist has been removed resulting in a nanocolumnar structure transferred into selective regions of the dielectric stack that coincide with the blocking mask pattern.

FIG. 5c shows a structure in which the resist has been removed after a nanocolumnar pattern is transferred into selective regions of the dielectric stack that coincide with the openings in the blocking mask pattern. Thus, the self-aligned litho resist allows for protection of the conductive region 230 even though it receives a blanket exposure by virtue of its reflectivity.

In accordance with the present invention, a patterned substrate containing structures having two or more distinct components is processed by a method wherein a resist pattern can be selectively developed over regions of a substrate with different compositions and combined with a low resolution blocking mask and/or a nanocolumnar film.

These patterning layers can be sacrificial and, in general, do not remain in the final structure. It will be clear to one skilled in the art that the application of a self-aligned layer by any of the approaches described below can be used in a process to generate a selective mask.

The present invention has been described with particular reference to the preferred embodiments. It should be understood that variations and modifications thereof can be devised by those skilled in the art without departing from the spirit and scope of the present invention. Accordingly, the present invention embraces all such alternatives, modifications and variations that fall within the scope of the appended claims.

What is claimed is:

1. A method of forming a self-aligned patterned layer on a substrate having thereon a pre-patterned film, comprising the steps of:

applying onto said substrate having thereon a pre-patterned film a solution of a masking material in a carrier;

removing at least a portion of said carrier to form a coating;

patternwise exposing said coating to radiation in conjunction with a blocking mask so that said radiation is transmitted through said coating and is reflected back to said coating to produce a patterned layer having exposed and unexposed regions with a given spatial intensity distribution; and developing said exposed and unexposed regions to reveal a mask pattern on said coating commensurate with said spatial intensity distribution generated during exposure to radiation to produce said self-aligned patterned layer on said pre-patterned film.

2. The method of claim 1, wherein said pre-patterned film on said substrate comprises a first set of regions of said substrate in said film having a first atomic composition and a second set of regions of said substrate having a second atomic composition that is different from said first composition.

3. The method of claim 2, wherein said first set of regions includes one or more metallic or conductive elements and wherein said second set of regions includes one or more dielectric materials.

4. The method of claim 1, wherein said coating is selected from the group consisting of: a chemically amplified and a chemically non-amplified photoresist.

5. The method of claim 1, wherein said coating is selected from the group consisting of: a positive tone photoresist, a negative tone photoresist, a positive tone thermal resist, and a negative tone thermal resist.

6. The method of claim 5, wherein said developed patterned resist is further exposed to a dry etch to remove any remaining resist thereby preventing imperfect self-aligned patterning.

7. A method of forming a self-aligned patterned layer on a substrate having thereon a pre-patterned film, comprising the steps of:

applying onto said substrate having thereon a pre-patterned film a solution of a masking material in a carrier;

removing at least a portion of said carrier to form a coating;

patternwise exposing said coating to radiation in conjunction with a blocking mask so that said radiation is transmitted through said coating and is reflected back to said coating to produce a patterned layer having exposed and unexposed regions with a given spatial intensity distribution; and developing said exposed and unexposed regions to reveal a mask pattern on said coating commensurate with said spatial intensity distribution generated during exposure to radiation to produce said self-aligned patterned layer on said pre-patterned film, wherein said mask pattern is used as a lift-off mask.

8. The method of claim 1, wherein said mask pattern is used as an etch mask.

9. A method of forming a self-aligned patterned layer on a substrate having thereon a pre-patterned film, comprising the steps of:

applying onto said substrate having thereon a pre-patterned film a solution of a masking material in a carrier;

removing at least a portion of said carrier to form a coating;

patternwise exposing said coating to radiation in conjunction with a blocking mask so that said radiation is transmitted through said coating and is reflected back to said coating to produce a patterned layer having exposed and unexposed regions with a given spatial intensity distribution; and developing said exposed and unexposed regions to reveal a mask pattern on said coating commensurate with said spatial intensity distribution generated during exposure to radiation to produce said self-aligned patterned layer on said pre-patterned film, wherein said mask pattern is used as sacrificial polish stop layer.

10. A method of forming a self-aligned patterned layer on a substrate having thereon a pre-patterned film, comprising the steps of:

applying onto said substrate having thereon a pre-patterned film a solution of a masking material in a carrier;

removing at least a portion of said carrier to form a coating;

patternwise exposing said coating to radiation in conjunction with a blocking mask so that said radiation is transmitted through said coating and is reflected back to said coating to produce a patterned layer having exposed and unexposed regions with a given spatial intensity distribution; and developing said exposed and unexposed regions to reveal a mask pattern on said coating commensurate with said spatial intensity distribution generated during exposure to radiation to produce said self-aligned patterned layer on said pre-patterned film, wherein said patterned substrate has two or more adjacent regions of different reflectivity.

11. A method of forming a self-aligned patterned layer on a substrate having thereon a pre-patterned film, comprising the steps of:

applying onto said substrate having thereon a pre-patterned film a solution of a masking material in a carrier;

removing at least a portion of said carrier to form a coating;

patternwise exposing said coating to radiation in conjunction with a blocking mask so that said radiation is transmitted through said coating and is reflected back to said coating to produce a patterned layer having exposed and unexposed regions with a given spatial intensity distribution; and developing said exposed and unexposed regions to reveal a mask pattern on said coating commensurate with said spatial intensity distribution generated during exposure to radiation to produce said self-aligned patterned layer on said pre-patterned film, wherein said exposure wavelength is less than 2 microns.

12. A method of forming a self-aligned patterned layer on a substrate having thereon a pre-patterned film, comprising the steps of:

applying onto said substrate having thereon a pre-patterned film a solution of a masking material in a carrier;

removing at least a portion of said carrier to form a coating;

patternwise exposing said coating to radiation in conjunction with a blocking mask so that said radiation is transmitted through said coating and is reflected back to said coating to produce a patterned layer having exposed and unexposed regions with a given spatial intensity distribution; and developing said exposed and unexposed regions to reveal a mask pattern on said coating commensurate with said spatial intensity distribution generated during exposure to radiation to produce said self-aligned patterned layer on said pre-patterned film, wherein two distinct wavelengths to which said coating is sensitive are used to generate the difference in delivered dose so that each wavelength is designed to isolate differences in reflectivity.

13. The method of claim 1, wherein said radiation is selected from the group consisting of: an actinic radiation, an electron beam, an ion beam and a combination thereof.

14. The method of claim 1, wherein said actinic radiation is selected from the group consisting of: ultraviolet (UV) radiation, visible radiation and infrared (IR) radiation.

15. The method of claim 1, wherein said pre-patterned film has a nanocolumnar structure.

16. The method of claim 1, wherein said pre-patterned film is a combination of a nanocolumnar and non-nanocolumnar structured film.

17. A structure prepared by a method comprising the steps of:

applying onto a substrate having thereon a pre-patterned film a solution of a masking material in a carrier;

removing at least a portion of said carrier to form a coating;

patternwise exposing said coating to radiation in conjunction with a blocking mask so that said radiation is transmitted through said coating and is reflected back to said coating to produce a patterned layer having exposed and unexposed regions with a given spatial intensity distribution; and developing said exposed and unexposed regions to reveal a mask pattern on said coating commensurate with said spatial intensity distribution generated during exposure to radiation and said blocking mask to produce said self-aligned patterned layer on said pre-patterned film.

18. A microelectronic device having a structure prepared by a method comprising the steps of:

applying onto a substrate of said microelectronic device having thereon a pre-patterned film a solution of a masking material in a carrier;

removing at least a portion of said carrier to form a coating;

patternwise exposing said coating to radiation in conjunction with a blocking mask so that said radiation is transmitted through said coating and is reflected back to said coating to produce a patterned layer having exposed and unexposed regions with a given spatial intensity distribution; and developing said exposed and unexposed regions to reveal a mask pattern on said coating commensurate with said spatial intensity distribution generated during exposure to radiation;

wherein said pre-patterned film is a self aligned patterned layer.

* * * * *